United States Patent
Beaman et al.

[11] Patent Number: 6,078,500
[45] Date of Patent: Jun. 20, 2000

[54] PLUGGABLE CHIP SCALE PACKAGE

[75] Inventors: Brian Samuel Beaman, Apex, N.C.; Keith Edward Fogel, Mohegan Lake, N.Y.; Paul Alfred Lauro, Nanuet, N.Y.; Da-Yuan Shih, Poughkeepsie, N.Y.

[73] Assignee: International Business Machines Inc., Armonk, N.Y.

[21] Appl. No.: 09/076,267

[22] Filed: May 12, 1998

[51] Int. Cl.[7] .................................................. H05K 7/20
[52] U.S. Cl. ........................ 361/704; 361/707; 361/710; 361/764; 257/706; 257/709; 257/723; 165/80.3; 165/185; 174/16.3; 29/850; 29/830; 29/848
[58] Field of Search .......................... 361/683, 690–697, 361/700, 761, 776, 734–736, 744, 763–769, 785–787, 811, 704, 707, 712–719; 439/66, 71, 91, 79, 586, 591, 86, 74; 29/837, 883, 843, 825, 877, 840, 878; 206/719, 724, 840, 878; 257/738, 737, 692, 697, 698, 734, 713, 693, 779; 174/16.3, 52.4, 35 GC, 52.3, 260

[56] References Cited

U.S. PATENT DOCUMENTS

| | | | |
|---|---|---|---|
| 3,795,037 | 3/1974 | Luttmer | 29/628 |
| 4,193,082 | 3/1980 | Dougherty | 357/80 |
| 4,998,885 | 3/1991 | Beaman | 439/66 |
| 5,161,984 | 11/1992 | Taylor et al. | 439/73 |
| 5,531,022 | 7/1996 | Beaman et al. | 29/850 |
| 5,703,753 | 12/1997 | Mok | 361/715 |

FOREIGN PATENT DOCUMENTS

| | | |
|---|---|---|
| WO 96/15458 | 5/1996 | WIPO . |
| WO 96/15459 | 5/1996 | WIPO . |
| WO 96/16440 | 5/1996 | WIPO . |

*Primary Examiner*—Leo P. Picard
*Assistant Examiner*—Michael Datskovsky
*Attorney, Agent, or Firm*—Thomas A. Beck

[57] ABSTRACT

A structure for packaging an electronic device. The package has: an electronic device having a first surface and an opposite second surface, the first surface having a plurality of first electrical contact locations; a substrate having a surface having a plurality of substrate electrical contact locations; a flexible interposer comprising a flexible material and a plurality of elongated electrical conductors disposed therein and extending from the first side to the second side, each of the elongated electrical conductors has a first end at the first side of the flexible interposer and a second end at the second side of the flexible interposer; the flexible interposer is disposed between the electronic device and the substrate; means for pushing the electronic device towards the substrate so that the flexible interposer is disposed between the first surface of the electronic device and the surface of the substrate so that the first ends of the elongated electrical conductors of the flexible interposer contact the first electrical contact locations at the first surface of the electronic device and so that the second ends of the elongated electrical conductors of the flexible interposer contact the substrate electrical contact locations; and, means for aligning the electronic device to the substrate so that the first and the second ends of the elongated electrical conductors of the flexible interposer align to the first electrical contact pads on the electronic device and to the substrate contact locations, respectively.

6 Claims, 9 Drawing Sheets

PLUGGABLE CHIP SCALE PACKAGE

FIELD OF SAID INVENTION

The present invention is directed to a package for an electronic device, in particular to packages for integrated circuit chips and more particularly to chip scale packages that are equal in size or slightly larger than the integrated circuit device.

BACKGROUND OF THE INVENTION

Integrated circuit (IC) devices and other electronic components are normally enclosed in a protective package to prevent physical damage to the device from handling, from process chemicals, or environmental exposure. The physical package also provides a means of electrical connection from the IC device to a set of pins, leads, or contacts of some sort. The pins, leads, or contacts are typically used to connect the IC device to a printed circuit board (PCB) assembly and other packaged IC devices. There are many different types of packages used for IC devices including dual inline packages (DIP), small outline packages (SOP), pin grid array packages (PGA), ball grid array packages (BGA), and land grid array packages (LGA). The type of package that is used depends on the number of I/O connections on the device as well as the product application.

Portable product applications such as cellular telephones, camcorders, and laptop computers require IC packages that are very small to keep the size and weight of the product to a minimum.

Chip scale packages (CSP) are a classification of IC package that are only slightly larger than the size of the bare die. The typical chip scale package footprint size ranges from 1 to 1.2 times the size of the bare die footprint. The chip scale package provides an advantage over other IC packages where size, weight, performance, and, cost are extremely critical. Chip scale packages are very similar to ball grid array packages (BGA), only smaller. Both CSP and BGA packages use solder balls or solder coated bumps to provide a connection to the PCB. The pitch between solder ball connections on a BGA package is typically between 1 to 2.5 mm while the pitch between connections on a chip scale package is typically between 0.5 to 1 mm.

The terminal contact pads on an IC device can be located along the periphery of the die or in an area array configuration. In order to keep the die size as small as possible, contacts located along the periphery of the die are placed as closely together as possible. The minimum spacing between peripheral contacts (0.08 to 0.1 mm) is determined by the physical limitations of the equipment used to bond wires or other connections to the contact pads. The minimum spacing between area array contacts (0.2 to 0.4 mm) is determined by the die size and the number of contact pads required. Since the minimum line spacing on a typical PCB is limited to 0.2 mm and the minimum via size is limited to 0.3 mm, it is difficult to attach an IC device directly to a PCB without some means of fanning out or redistribution of the contacts on the IC device to a wider spaced array of contacts. The chip scale package is designed to provide the redistribution from the closely spaced contacts on the IC device to a wider array of contacts as well as provide a means of controlling the stresses due to thermal expansion mismatch between the silicon die and the epoxy glass PCB.

The thermal coefficient of expansion (TCE) for the printed circuit board is much higher than the TCE of the IC device. The mismatch between the TCE of the printed circuit card and the IC device would cause the connections to break after repeated thermal cycling caused by the power on and off of the device under normal application conditions. In order to avoid this problem, it is necessary to provide a compliant interface between the IC device and the PCB or encapsulate the solder connections in a semi-rigid material to absorb or dissipate the cyclic stresses.

Thermal performance of the package is critical to high density and high performance IC devices. The smaller package size and footprint of the chip scale package limits the surface area to dissipate heat by convection. In order to keep the operating temperature of the IC device under control, it is often necessary to use a heat sink to increase the surface area and spread the heat away from the device more efficiently.

Although a majority of CSP devices will be permanently attached to a PCB, it is desirable for certain applications to be able to add or replace an IC device for upgrading the function of a product. While many chip scale packages use a compliant interface between the IC device and the connection to the PCB, the interface is not designed to be a pluggable connection. The ideal requirements for a pluggable interconnection include a compliant or spring conductor with Au or Pd/Ni contact surfaces, a mating action that creates a wiping contact motion, and a redundant contact geometry.

There are a number of commercially available connectors for BGA and LGA packages. These connectors are separate components from the IC package and use a variety of contact geometries and materials. For a pluggable chip scale package, the contact geometry must be proportionately smaller than a similar BGA or LGA connector. Conventional metal spring contacts are difficult to form for connections closer than 25 mils. Elastomeric connectors can be made for contact pitches in the range of 10 to 25 mils. Uneven spacing and high resistance of the contact elements are a limiting factor for most elastomeric connectors.

Alignment of a BGA or LGA package to the connector and PCB becomes more challenging as the contact pitch gets smaller. The alignment tolerance for a pluggable CSP would be less than ±1 mil for a contact pitch of 20 mils. Although TCE is not a concern for solder joint fatigue life in a pluggable chip scale package, excessive TCE mismatch between the CSP contacts and the PCB could cause misalignment of the contact on a large IC device with close spaced contacts.

A clamping fixture is an additional requirement for connecting an LGA package to a PCB. The clamping fixture is designed to press the LGA package against the interposer connector and the PCB. The clamping fixture compresses the contact elements on the interposer connector to create the required normal force for a reliable connection. The clamping fixture typically provides a means of aligning the LGA package to the interposer connector and the contacts on the PCB. A pluggable chip scale package would have similar alignment and clamping requirements to an LGA package.

Chip scale packages includes chip on board, flip chip, micro BGA, SLICC, and OMPACS. Chip on board (COB) is a packaging technique that is used to bond a bare IC device to a PCB with the contact pads facing away from the surface of the PCB and uses conventional wire bonded connections from the IC contact pads to the pads on the PCB. The COB package is encapsulated in an epoxy material for protection from mechanical and chemical damage. Flip chip or C4 packaging uses solder balls on the IC contact pads for direct connection to the PCB or other wiring substrate. Micro BGA packaging uses a polyimide film circuit with solder balls for connection to the PCB and compliant leads connecting the IC device to the polyimide film circuit along with a layer of compliant material separating the IC device from the polyimide film circuit. The slightly larger than IC carrier (SLICC) uses flip chip connections for attachment to an FR4 carrier with redistribution wiring and solder balls for connection from the FR4 carrier to the PCB. The SLICC uses an underfill between the IC device and the FR4 carrier to control thermal stresses on the flip chip connections. Overmolded pad array carriers (OMPAC) use conventional wire bonds to connect the IC device to a plastic carrier with solder balls used for connection to the PCB. The plastic carrier is overmolded similar to other plastic packages such as DIP and SOP packages.

U.S. application Ser. No. 08/754,869 filed on Nov. 11, 1996, the teaching of which is incorporated herein by reference describes a high density test probe for integrated circuit devices. The IC wafer probe structure is similar to the compliant interface used for the pluggable chip scale package. The probe structure described in this docket uses short metal wires that are bonded on one end to the fan out wiring on a rigid substrate. The wires are encased in a compliant polymer material to allow the probes to compress under pressure against the integrated circuit device. The wire probes must be sufficiently long and formed at an angle to prevent permanent deformation during compression against the integrated circuit device. Although the compliant interface uses a similar integrated wire conductor, ball shaped contact, and elastomeric material surrounding the wires, the IC packaging requirements includes additional features that are unique to the pluggable chip scale package.

There are a number of commercially available connectors for BGA and LGA packages. These connectors are separate components from the IC package and use a variety of contact geometries and materials. Conventional metal spring contacts can be formed in a variety of shapes to produce an interposer contact. Conventional metal spring contacts are typically contained in a plastic housing that have individual openings for each of the contact springs and corresponds to the array of pads or bumps on the IC package and the pads on the PCB. Elastomeric connectors are available that contain conductive wires or particles embedded in a sheet of elastomer material. The elastomer material acts as a spring element to press the conductive particles against the mating surfaces. As a separate component, an interposer connector must be aligned to both the PCB and the IC package.

SUMMARY OF THE INVENTION

It is the object of the present invention to provide a chip scale package that has a compliant, pluggable interface for connection to a printed circuit board.

Another object of the present invention is to provide a pluggable chip scale package that includes a means of aligning the contact interface to the contact pads on the printed circuit board.

A further object of the present invention is to provide a pluggable chip scale package that includes a means of mechanical retention to create a uniform normal force between the contact interface on the chip scale package and the contact pads on the printed circuit package.

An additional object of the present invention is to provide a chip scale package with a means of fanning out or redistribution of the contacts on the chip to a larger contact pitch to provide additional spacing for signal wiring on the printed circuit card.

It is an object of the present invention to provide an apparatus for packaging an IC device with a plurality of contact pads comprising: a first IC device having a first surface; the first surface having a plurality of contact locations; a plurality of ball bonds attached to the plurality of contact locations; a plurality of wires extending outward from the ball bonds, away from the first surface on the IC device.

It is another object of the present invention to provide an IC device package further including a plurality of ball shaped contacts on the ends of the plurality of wires.

It is another object of the present invention to provide an IC device package further including a layer of elastomer material surrounding the plurality of wires.

It is another object of the present invention to provide an IC device package further including a wire geometry that is angled away from the center of the IC device for fanning out the contact locations on the IC device to a wider spaced array of contacts.

It is another object of the present invention to provide an IC further including a heat sink attached to a second surface of the IC device using a thermally conductive adhesive.

It is another object of the present invention to provide an IC further including alignment features in the heat sink.

It is another object of the present invention to provide an IC further including a fixture for aligning the plurality of wire contacts to a corresponding plurality of contact pads on a printed circuit board. The fixture also having a means to press the plurality of wire contacts against the PCB contact pads.

It is another object of the present invention to provide an IC further including wire geometries that are both angled away from the center of the IC device and angled towards the center of the IC device and used for fanning out the contact locations on the IC device to a wider spaced array of contacts.

It is another object of the present invention to provide an IC further including wire geometries that are both angled and perpendicular to the first surface of the IC device.

It is another object of the present invention to provide an IC further including a coating of a barrier metal on the surface of the plurality of wires and the ball shaped contacts.

It is another object of the present invention to provide an IC further including an elastomer material surround the plurality of wires that is compatible with high temperatures required for solder attachment to a printed circuit board.

It is another object of the present invention to provide an IC further including a flexible circuit connection from the ends of the plurality of wires to a plurality of contacts on a redistributed area array grid.

It is another object of the present invention to provide an IC further including a layer of elastomer material between the IC device and the flexible circuit.

A broad aspect of the structure of the present invention is a package for an electronic device. The package has: an electronic device having a first surface and an opposite second surface the first surface having a plurality of first electrical contact locations; a substrate having a surface having a plurality of substrate electrical contact locations; a flexible interposer comprising a flexible material and a plurality of elongated electrical conductors disposed therein and extending from the first side to the second side, each of the elongated electrical conductors has a first end at the first side of the flexible interposer and a second end at the second side of the flexible interposer; the flexible interposer is disposed between the electronic device and the substrate; means for pushing the electronic device towards the substrate so that the flexible interposer is disposed between the first surface of the electronic device and the surface of the substrate so that the first ends of the elongated electrical conductors of the flexible interposer contact the first electrical contact locations at the first surface of the electronic device and so that the second ends of the elongated electrical conductors of the flexible interposer contact the substrate electrical contact locations; and, means for aligning the electronic device to the substrate so that the first and the second ends of the elongated electrical conductors of the flexible interposer align to the first electrical contact pads on the electronic device and to the substrate contact locations, respectively.

BRIEF DESCRIPTION OF THE DRAWINGS

These and other objects, features, and advantages of the present invention will become apparent upon further consideration of the following detailed description of the invention when read in conjunction with the drawing figures, in which.

DETAILED DESCRIPTION OF THE INVENTION

Preferred Embodiment

Figure 1:
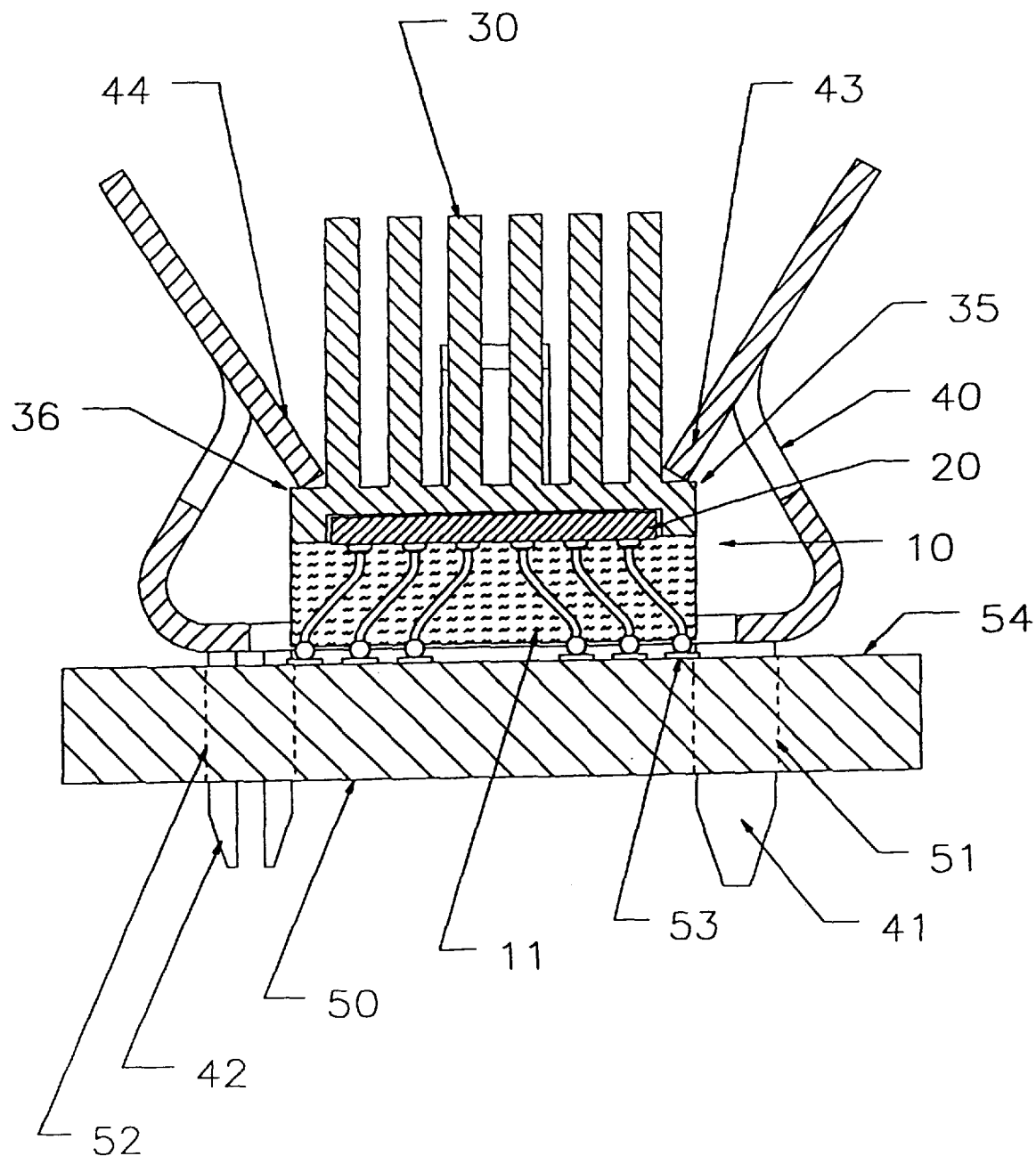
FIG. 1 shows a cross section of a pluggable chip scale package attached to a printed circuit board using a clamping fixture.

FIG. 1 shows a cross section of the pluggable chip scale package (10) attached to a printed circuit board (50). The pluggable chip scale package (10) includes the bare die (20), the heat spreader or heat sink (30), the compliant integrated contact interface (11), and the clamping fixture(40). The clamping fixture (40) is used to align the contact interface (11) on the pluggable chip scale package (10) to the contacts (53) on the printed circuit board (50). The clamping fixture (40) shown in the preferred embodiment is formed from a single piece of spring sheet metal. The clamping fixture (40) is located and attached to the printed circuit board (50) using a pair of board alignment pins (41) and a pair of board lock (42) features. The board alignment pins (41) and board lock features (42) are soldered to the plated through holes (51,52) in the printed circuit board (50). The board alignment pins (41) and the board lock features (42) are formed with a tapered ends to help guide the pins and locks into the corresponding holes (51,52) in the printed circuit board (50). The clamping fixture (40) is also used to press the compliant contact interface (11) of the chip scale package (10) against the contacts (53) on the printed circuit board (50).

Figure 2:
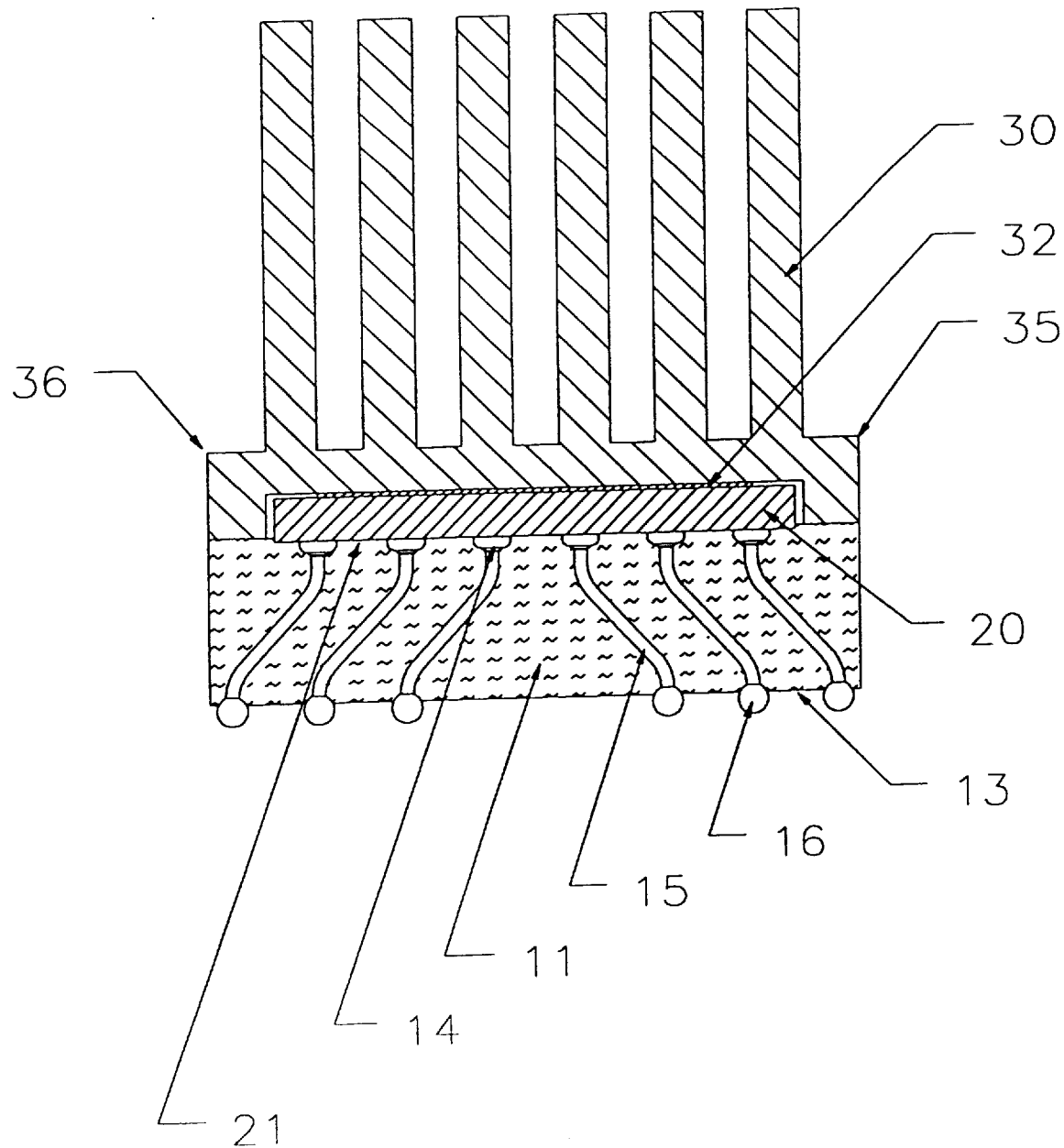
FIG. 2 shows a cross section of a pluggable chip scale package with the details of the compliant interface connections.

FIG. 2 shows a cross section of the pluggable chip scale package (10) and the details of the compliant contact interface (11). The bare die (20) is accurately positioned and bonded to the heat sink (30) using a conductive adhesive (32) or other suitable material to allow efficient heat transfer from the IC device (20) to the heat sink (30). The compliant contact interface (11) on the chip scale package includes an array of wires bonded to the first surface (21) of the IC device (20), ball shaped contacts (16) formed on the ends of the wires (15), and an elastomeric material (13) surrounding the array of wire (15). A modified ball bonding technique is used to attach the wires (15) to the IC device (20). The wires (15) can be formed at a uniform angle as shown in FIG. 2 with the center of the IC device (20) as the axis of symmetry. The wires (15) can also be formed at a right angle to the surface (21) of the IC device (20) or at varying angles to fan out the ball shaped contacts (16) to a larger area array grid.

Figure 3:
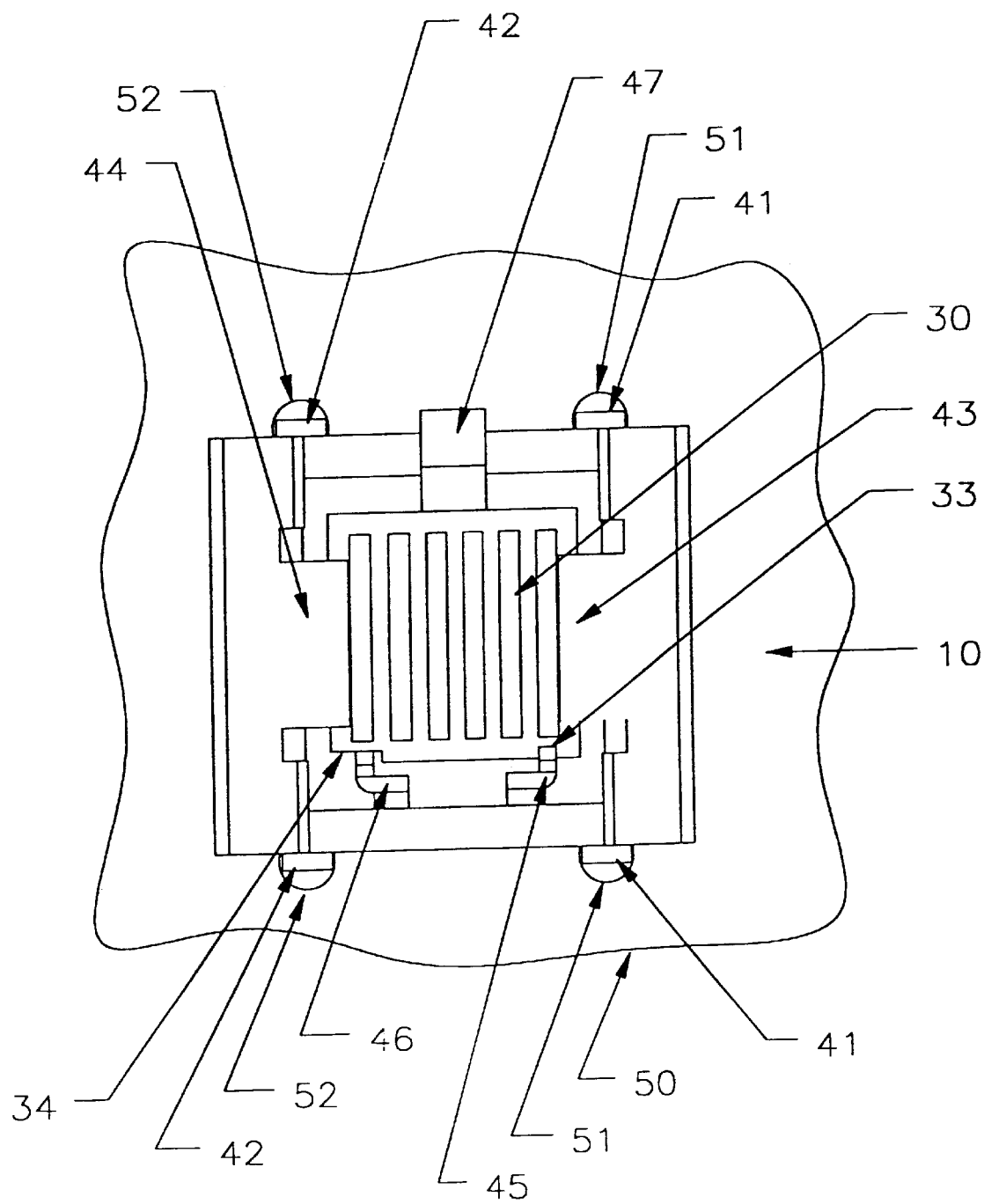
FIG. 3 shows a top view of the pluggable chip scale package and the alignment features on the heat sink and clamping fixture.

FIG. 3 shows a top view of the pluggable chip scale package (10) attached to the PCB (50). The top view shows more clearly the pair of board alignment pins (41) and the pair of board lock features (42) along with the corresponding holes (51,52) used to align and lock the clamping fixture to the printed circuit board (50). FIG. 3 also shows two features (45,46) on the clamping fixture (40) and the corresponding features (33, 34) on the heat sink (30) that are used to align the pluggable chip scale package (10) to the PCB (50).

Figure 4:
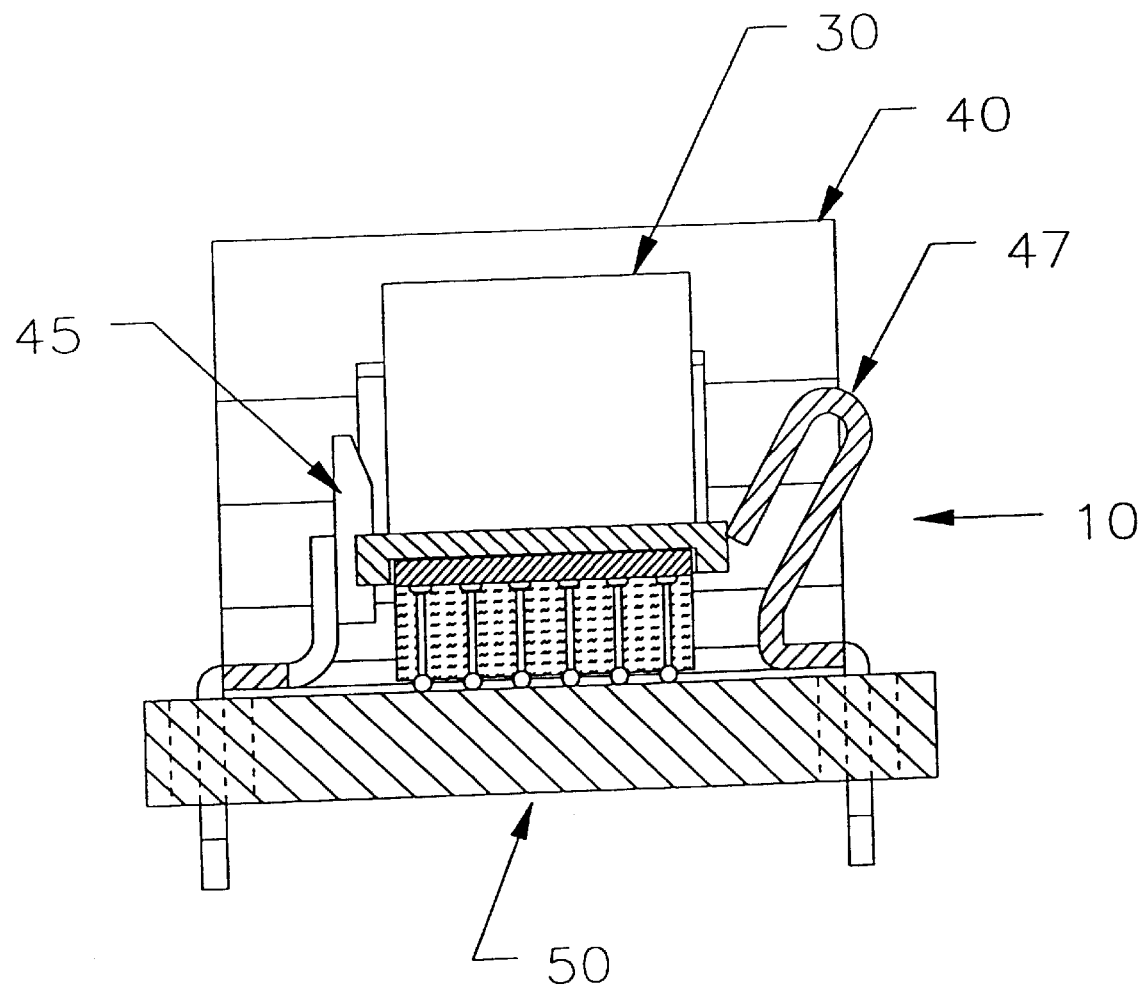
FIG. 4 shows another cross section of a pluggable chip scale package and the alignment and spring features in the clamping fixture.

FIG. 4 shows another cross section of the pluggable chip scale package (10) attached to a PCB (50). This section shows a spring feature (47) that is used to push the heat sink (30) against the alignment features (45) on the clamping fixture (40).

Figure 5:
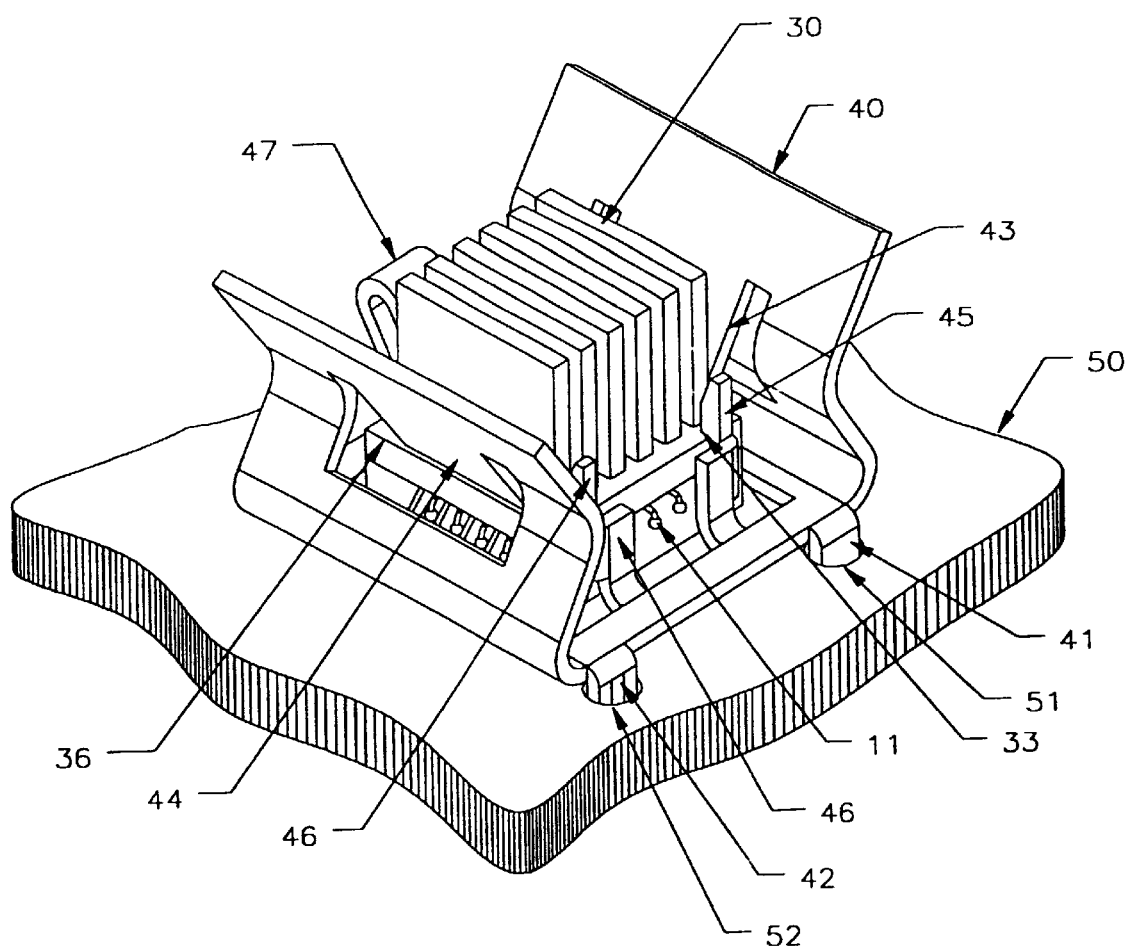
FIG. 5 shows an isometric view of the top side of the pluggable chip scale package attached to a printed circuit card.

FIG. 5 shows an isometric view of the top side of the pluggable chip scale package (10). The pluggable chip scale package (10) is inserted into the clamping fixture (40) by aligning the two locating grooves (33, 34) on the heat sink (30) with the alignment features (45, 46) on the clamping fixture (40). The sides (43, 44) of the clamping fixture (40) move apart as the chip scale package (10) is inserted into the clamping fixture (40). A force exerted on the top of the heat sink (30) is required to press the chip scale package (10) against the PCB (50) and compress the compliant interface (11). Once the compliant interface (11) is fully compressed, the sides (43, 44) of the clamping fixture (40) snap over the edges (35, 36) of the heat sink (30) and clamp the chip scale package (10) securely against the PCB (50). The compliant interface (11) is shown as having a transparent elastomer material.

Figure 6:
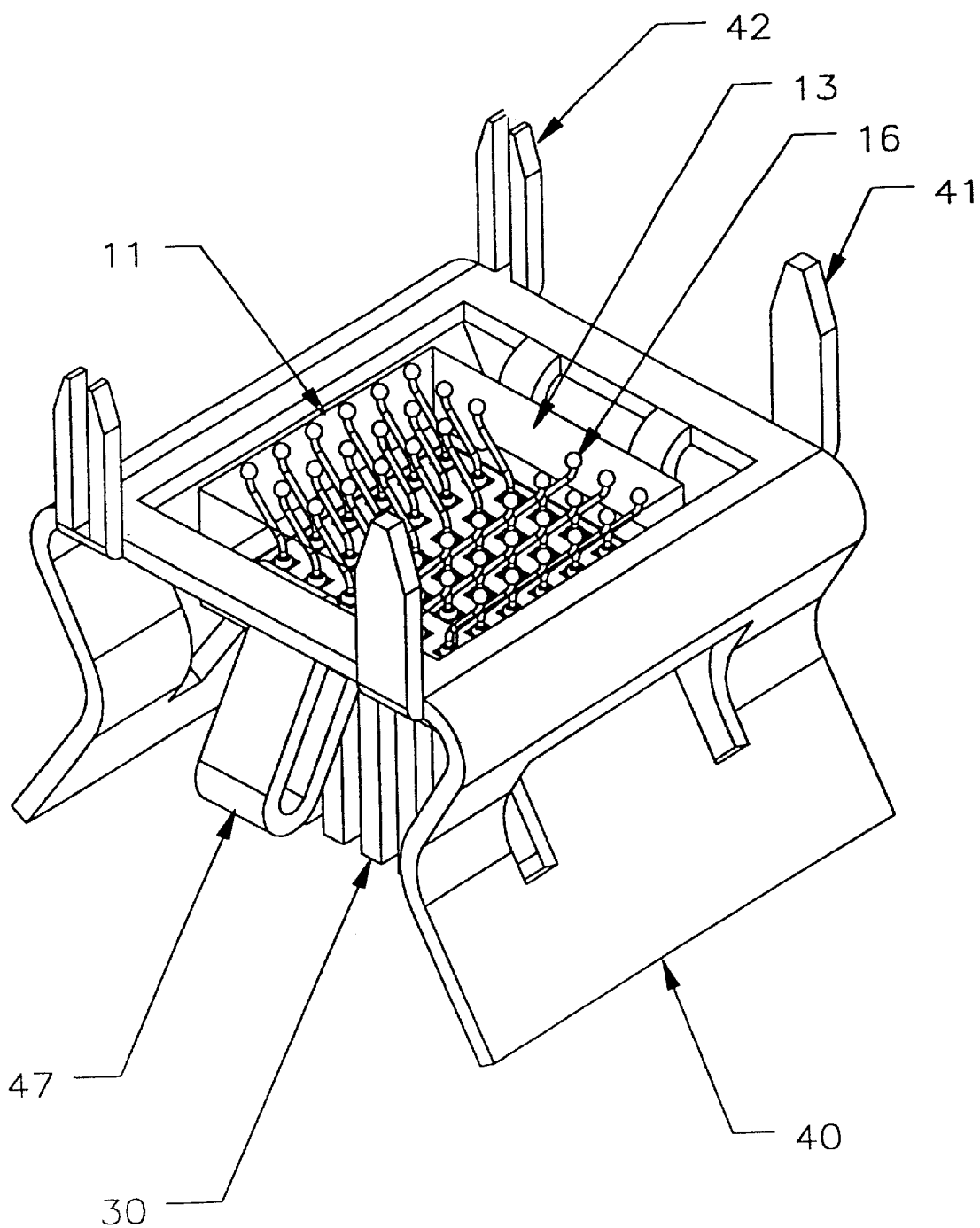
FIG. 6 shows an isometric view of the bottom side of the pluggable chip scale package (without the printed circuit card).

FIG. 6 shows an isometric view of the bottom side of the pluggable chip scale package (10). The compliant interface (11) is shown as having a transparent elastomer material (13). The bottom of the compliant interface (11) shows the separation between the two arrays of ball shaped contacts (16). The separation between the two arrays of contacts is useful for wiring to the inner rows of contacts on the PCB (50).

Alternate Embodiments

Figure 7:
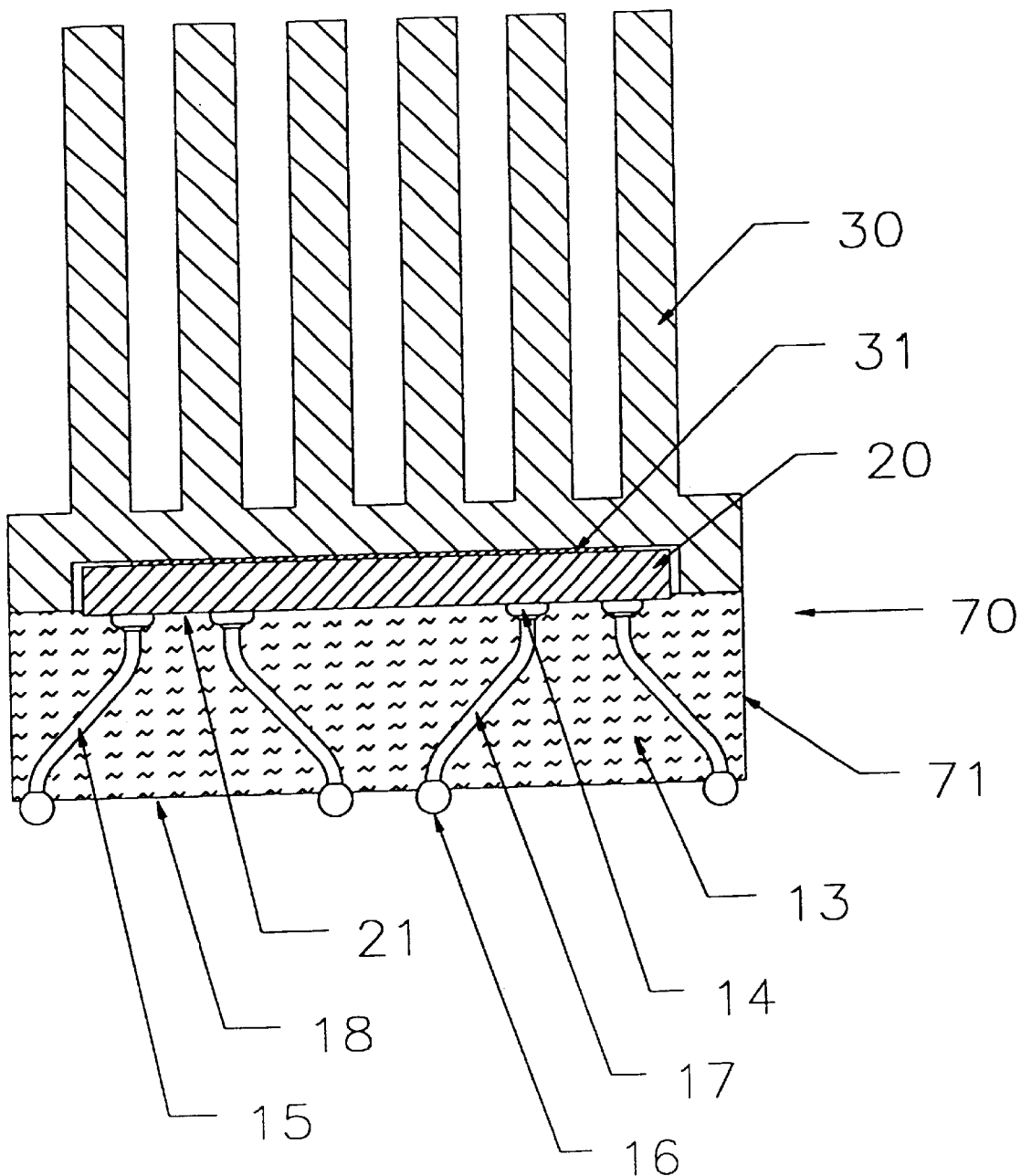
FIG. 7 shows a first alternate embodiment of the pluggable chip scale package with the compliant leads angled in opposite directions.

FIG. 7 shows a first alternate embodiment of the pluggable chip scale package (70) with the compliant leads (15, 17) angled in opposite directions. The arrangement of wires facing away (15) from the center of the IC device (20) and wires facing towards (17) the center of the IC device (20) creates additional space between the ball shaped contacts (16) on the surface (18) of the compliant interface (71). Again, the additional space between contacts is useful for wiring to the contacts on the PCB (50). Other combinations of wire direction and angles can be used to create wider spacing between the ball shaped contacts (16) on the surface (18) of the compliant interface (71).

Figure 8:
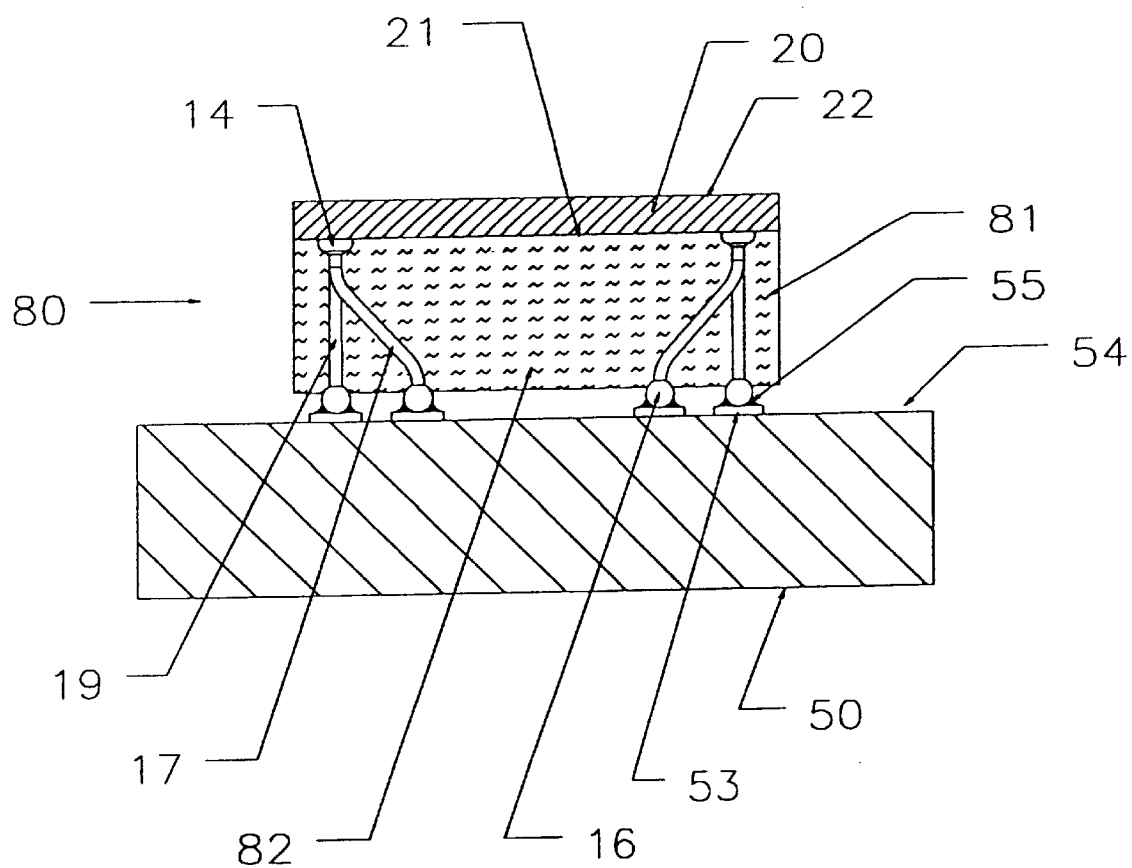
FIG. 8 shows a second alternate embodiment of the chip scale package used for soldered attachment to a printed circuit board.

FIG. 8 shows a second alternate embodiment of the chip scale package (80) used for soldered attachment (55) of an IC device (20) to a printed circuit board (50). The compliant interface (81) uses a combination of perpendicular wires (19) and wires (17) angled towards the center of the IC device (20). In order to use the compliant interface (81) for a soldered connection (55), the ball shaped contacts (16) and the wire connections (17, 19) need to be covered with a barrier layer of Pd or other suitable material (Ni, Pt) to prevent the formation of intermetallics with the Sn/Pb solder (55). The ball shaped contacts (16) on the soldered chip scale package (80) must be manually aligned to the pads (53) on the surface (54) of the PCB (50). The elastomer material (82) used for the compliant interface (81) must be able to withstand the solder reflow temperature for a limited period of time.

Figure 9:
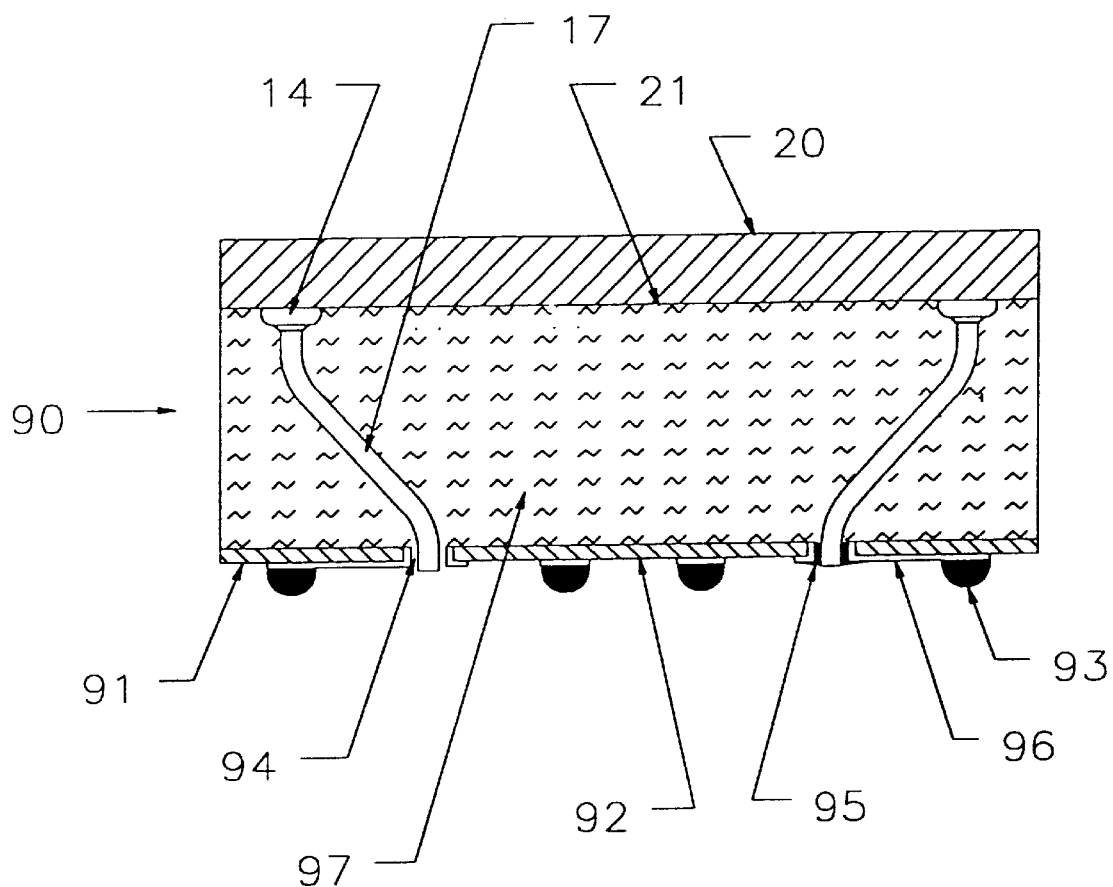
FIG. 9 shows a third alternate embodiment of the chip scale package used for soldered attachment to a printed circuit board.

FIG. 9 shows a third alternate embodiment of the chip scale package (90) used for soldered attachment to a printed circuit board (not shown). The third alternate embodiment (90) uses a small flex circuit (90) to provide a secondary means of redistribution for the array of contacts (93) to be soldered to the PCB. Wires (17) angled towards the center of the IC device (20) are used to provide a connection between the IC device (20) and the flex circuit (91). The ends of the wires (17) do not have ball shaped contacts and are aligned with corresponding through holes (94) in the flex circuit (91). The hole (94) is shown in FIG. 9 without a soldered connection to the wire (17). The through holes (94) in the flex circuit (91) are plated and connected (96) to the array of contacts (93) on the first surface (92) of the flex circuit (91). The ends of the wires (17) are solder attached (95) to the plated through holes (94) in the flex circuit (91). The array of contacts (93) on the first surface (92) of the flex circuit (91) can be solder balls or solder coated metal protrusions of uniform size. The space between the IC device (20) and the flex circuit (91) is filled with a compliant material (97).

While we have described our preferred and alternate embodiments of our invention, it will be understood that those skilled in the art, both now and in the future, may make various improvements and enhancements which fall within the scope of the claims which follow. These claims should be construed to maintain the proper protection for the invention first disclosed.

What is claimed is:

1. A structure comprising:
an electronic device having a first surface and an opposite second surface, said first surface having a plurality of first electrical contact locations and said second surface having a heat sink attached thereto;
a substrate having a surface having a plurality of substrate electrical contact locations;
a flexible interposer comprising an elastomeric layer material and a plurality of elongated electrical conductors disposed therein and extending from its first side to its second side, each of said elongated electrical conductors having a first end at said first side of said flexible interposer and a second end at said second side of said interposer, said first ends of said plurality of said elongated electrical conductors being a ball bond attached to one of said plurality of substrate contact locations, and said second ends of said elongated electrical conductors including a plurality of ball shaped contacts;
said elongated electrical conductors being substantially perpendicular to said electronic device and said interposer and being coated with a barrier metal;
each of said plurality of elongated electrical conductors is a continuous unitary wire;
said interposer is disposed between said electronic device and said substrate;
means for pushing said electronic device towards said substrate so that said flexible interposer is disposed between said first surface of said electronic device and said surface of said substrate so that said first ends of said elongated electrical conductors at said first surface of said electronic device and so that said second ends of said elongated electrical conductors of said flexible interposer contact said substrate electrical contact locations;
said heat sink attached to said second surface forming means for aligning said electronic device to said substrate so that said seconds ends of said elongated electrical conductors of said flexible interposer align to said first electrical contact locations on said electronic device and to said substrate contact locations respectively;
said heat sink comprising:
a clamping fixture which is formed from a single piece of spring sheet metal, said clamping fixture is located and attached to said substrate using a pair of substrate alignment pins and a pair of substrate lock features, said substrate alignment pins and substrate lock features are affixed to and in said substrate, said substrate alignment pins and the substrate lock features are formed with tapered ends to help guide the pins and locks into corresponding holes in said substrate, said clamping fixture provides means for pushing;
said electronic device has a center and wherein said plurality of elongated electrical conductors have a geometry that is angled away from said center of said electronic device for fanning out said contact locations on said electronic device to a wider spaced array of substrate electrical contact locations.

2. A structure comprising:
an electronic device having a first surface and an opposite second surface, said first surface having a plurality of device electrical contact locations and said second surface includes a heat sink attached thereto;
a substrate having a surface having a plurality of substrate electrical contact locations;
a plurality of elongated electrical conductors disposed between said electronic device and said substrate;
each of said plurality of elongated electrical conductors is a continuous unitary wire;
said substrate electrical contact locations has a different geometrical arrangement than said device electrical contact locations;
said heat sink being means for aligning said electronic device to said substrate so that said seconds ends of said elongated electrical conductors align to said first electrical contact locations on said electronic device and to said substrate electrical contact locations respectively;

said heat sink comprising:
- a clamping fixture which is formed from a single piece of spring sheet metal, said clamping fixture is located and attached to said substrate using a pair of substrate alignment pins and a pair of substrate lock features, said substrate alignment pins and substrate lock features are affixed to and in said substrate, said substrate alignment pins and the substrate lock features are formed with tapered ends to help guide the pins and locks into corresponding holes in said substrate, said clamping fixture provides means for pushing;

said elongated electrical connectors have a shape to transform from the geometrical arrangement of said device electrical contacts locations to the geometrical arrangement of said substrate electrical contact locations;

said electronic device has a center and wherein said plurality of elongated conductors have a geometry that is angled away from said center of said electronic device for fanning out said contact locations on said electronic device to a wider spaced array of substrate electrical contact locations.

3. A structure according to claim 1 further including:

said substrate electrical contact locations has a different geometrical arrangement than said device electrical contact locations;

said elongated electrical conductors have a shape to transform from the geometrical arrangement of said device electrical contacts locations to the geometrical arrangement of said substrate electrical contact locations;

each of said plurality of elongated electrical conductors is a continuous unitary wire;

said plurality of substrate electrical contact locations are electrically connected to said plurality of electronic device electrical contact locations by said plurality of said elongated electrical conductors;

said plurality of elongated electrical conductors have a plurality of shapes to accommodate said different geometrical arrangement.

4. A structure according to claim 1, further including a heat sink attached to said second surface of said electronic device, said heat sink comprises said means for aligning; said heat sink comprises:

- a clamping fixture which is formed from a single piece of spring sheet metal, said clamping fixture is located and attached to said substrate using a pair of substrate alignment pins and a pair of substrate lock features, said substrate alignment pins and substrate lock features are affixed to in said substrate, said substrate alignment pins and the substrate lock features are formed with a tapered ends to help guide the pins and locks into the corresponding holes in said substrate, said clamping fixture provides said means for pushing.

5. A structure according to claim 2, further including a heat sink attached to said second surface of said electronic device, said heat sink comprises said means for aligning; said heat sink comprises:

- a clamping fixture which is formed from a single piece of spring sheet metal, said clamping fixture is located and attached to said substrate using a pair of substrate alignment pins and a pair of substrate lock features, said substrate alignment pins and substrate lock features are affixed to in said substrate, said substrate alignment pins and the substrate lock features are formed with a tapered ends to help guide the pins and locks into the corresponding holes in said substrate, said clamping fixture provides said means for pushing.

6. A structure according to claim 3, further including a heat sink attached to said second surface of said electronic device, said heat sink comprises said means for aligning; said heat sink comprises:

- a clamping fixture which is formed from a single piece of spring sheet metal, said clamping fixture is located and attached to said substrate using a pair of substrate alignment pins and a pair of substrate lock features, said substrate alignment pins and substrate lock features are affixed to in said substrate, said substrate alignment pins and the substrate lock features are formed with a tapered ends to help guide the pins and locks into the corresponding holes in said substrate, said clamping fixture provides said means for pushing.

* * * * *